US008471627B2

(12) United States Patent
Slavov

(10) Patent No.: US 8,471,627 B2
(45) Date of Patent: Jun. 25, 2013

(54) CROSS CURRENT MINIMIZATION

(75) Inventor: Nedialko Slavov, Zurich (CH)

(73) Assignee: ST-Ericsson SA, Plan-les-Ouates (CH)

( * ) Notice: Subject to any disclaimer, the term of this patent is extended or adjusted under 35 U.S.C. 154(b) by 60 days.

(21) Appl. No.: 13/318,095

(22) PCT Filed: Apr. 27, 2010

(86) PCT No.: PCT/EP2010/055627
§ 371 (c)(1),
(2), (4) Date: Oct. 28, 2011

(87) PCT Pub. No.: WO2010/125066
PCT Pub. Date: Nov. 4, 2010

(65) Prior Publication Data
US 2012/0056670 A1    Mar. 8, 2012

(30) Foreign Application Priority Data

Apr. 28, 2009    (EP) ...................................... 09158970

(51) Int. Cl.
*H03F 3/38*    (2006.01)
(52) U.S. Cl.
USPC ............................................ 330/10; 330/251
(58) Field of Classification Search
USPC ........................................ 330/10, 251, 207 A
See application file for complete search history.

(56) References Cited

U.S. PATENT DOCUMENTS

| | | | |
|---|---|---|---|
| 6,111,216 A * | 8/2000 | Stava | 219/130.51 |
| 6,614,208 B2 | 9/2003 | Narita | |
| 7,023,268 B1 | 4/2006 | Taylor et al. | |
| 7,190,596 B2 | 3/2007 | Durbaum et al. | |
| 7,960,997 B2 * | 6/2011 | Williams | 324/762.09 |
| 2007/0139839 A1 | 6/2007 | Yoshihara | |
| 2008/0278984 A1 | 11/2008 | Stanley | |
| 2009/0039869 A1 * | 2/2009 | Williams | 324/123 R |
| 2010/0060257 A1 * | 3/2010 | Azrai et al. | 324/76.11 |

FOREIGN PATENT DOCUMENTS

WO    2008050267 A    5/2008

OTHER PUBLICATIONS

Patent Cooperation Treaty International Search Report and Written Opinion for PCT/EP2010; Aug. 4, 2010; pages.
European Search Report for EP 09158970; Jun. 22, 2009, 5 pages.
Berkhout M: "Integrated Overcurrent Protection System for Class-D Audio Power Amplifiers"; IEEE Journal of Solid-State Circuits, IEEE Service Center, Piscataway, NJ, US, vol. 40, No. 11, Nov. 1, 2005, pages.

* cited by examiner

*Primary Examiner* — Henry Choe
(74) *Attorney, Agent, or Firm* — Howison & Arnott, L.L.P.

(57) ABSTRACT

A method of optimizing cross current in class D amplifiers and simultaneously minimizing the harmonic distortion is provided. The method overcomes the problem of using the limited speed voltage comparators often used in cross current preventing circuits. Method embodiments are based on introducing a replica amplifier with a current sensor matched to a main amplifier. The duration of a sensed cross current within the replica amplifier is compared by a current comparator with a small enough reference current. The comparator output generates a pulse with a duration equal to the duration of the cross current event in the replica amplifier. The duration of that pulse is measured and used to generate a dead time pulse for blanking amplifier pre-driver inputs.

16 Claims, 10 Drawing Sheets

CROSS CURRENT MINIMIZATION

CROSS-REFERENCE TO RELATED APPLICATIONS

This application is a U.S. National Phase application submitted under 35 U.S.C. §371 of Patent Cooperation Treaty application serial no. PCT/EP2010/055627, filed Apr. 27, 2010, and entitled CROSS CURRENT MINIMISATION, which application claims priority to European patent application serial no. EP 09158970.5, filed Apr. 28, 2009, and entitled CROSS CURRENT MINIMISATION.

Patent Cooperation Treaty application serial no. PCT/EP2010/055627, published as WO 2010/125066, and European patent application serial no. EP 09158970.5, are incorporated herein by reference.

TECHNICAL FIELD

The present invention relates to a method of cross current in class D amplifiers. More specifically, the proposed method relies on using a replica amplifier for dead time definition. The invention equally relates to a corresponding module where the method can be implemented and to a computer program product comprising instructions for implementing the steps of the method.

BACKGROUND

A class D amplifier, also known as a switching amplifier, is an electronic amplifier that uses a switching mode of a switch, such as a transistor, to regulate power delivery. Class D amplifiers are preferable for many applications due to their high power efficiency.

The switching amplifiers usually contain a push-pull output stage with large sized transistors. One typical problem is the cross current, also known as shoot-through current, through the upper and bottom side of the amplifier. Usually each side contains only either metal oxide semiconductor (MOS) transistors of type n or p. The cross current is due to the fact that the switching of the transistors requires some time and during the transition there is a moment when the transistors of both sides are conducting simultaneously thereby introducing a short connection between a power supply and ground. This short connection becomes more critical for large sized output stages or high voltage supplies and may introduce a considerable current spike increasing the power consumption and heating of the devices. In some severe cases the cross current may even reduce the reliability and lifetime of a class D amplifier.

To avoid the cross current, a dead time between the switching has to be introduced. Setting a proper value for the dead time is always a compromise due to the dependence of the switching time on different factors such as temperature, technology variations, supply voltage, etc. However, increasing the dead time leads to a rise of undesired total harmonic distortions (THD). One typical output stage of a complementary metal oxide semiconductor (CMOS) technology implementation is presented in FIG. 1. FIG. 2 illustrates the definition of dead time in the configuration of the CMOS output stage of FIG. 1. With the rising edge of the input pulse width modulated (PWM) signal, the MN transistors are turned on, whereas with the falling edge of the PWM signal the MP transistors are switched on.

A common practice is to use a fixed dead time with some margins. However, this has the drawback that additional harmonic distortions are introduced. A typical dead time value is about 50-100 ns. Variable dead time can also be used. Current methods are mostly based on the sensing of the gate voltage of the output transistors of the amplifier (i.e. in case of FIGS. 1 and 2 transistors MN1, MN2, MN3, MP1, MP2 and MP3) and disabling the opposite side pre-driver (e.g. for the MN transistors the opposite side pre-driver would be the P_driver) until the active side is not completely or almost switched off. For the configuration of FIG. 3, this is illustrated in FIG. 4.

The comparator Comp_N will apply a blanking potential to N_Driver until the output potential of P_Driver reaches the reference voltage VTH1. The blanking potential will keep the output of N_Driver low, i.e. the MN transistors are switched off. The comparator Comp_P will apply a blanking potential (i.e. the MP transistors are switched off) to P_Driver until the output potential of N_Driver falls down below the reference voltage VTH2. The purpose of the blanking potential is thus to prevent the transistors from switching on.

After the end of the blanking potentials, the pre-drivers will be enabled and their outputs will start to execute the transition. One additional delay will be introduced due to the limited speed of the comparators. The limited speed of the comparators may bring a significant inaccuracy for some of the CMOS technologies, especially high voltage (HV) CMOS technologies often used in integrated power amplifiers. Another source of inaccuracy may be the matching of the blanking signal to the rising/falling time of the pre-driver, but not directly to the cross current spike in the output stage.

It is thus the object of the present invention to overcome the above-identified difficulties and disadvantages by proposing an improved solution for avoiding cross current in class D amplifiers.

SUMMARY

According to a first aspect of the invention, there is provided a method of minimizing cross current in a main amplifier comprising switches.

Thus, the present invention provides a very efficient method for minimizing or even completely avoiding the cross current. The dead time is matched directly to the duration of the cross current. The high accuracy of the dead time definition is achieved by relatively simple implementation and the harmonic distortions can be minimized. The method can be used in high speed buffers due to high speed of the current comparators.

According to a second aspect of the invention, there is provided a computer program product comprising instructions for implementing the method according to the first aspect of the invention when loaded and run on an electronic device.

According to a third aspect of the invention, there is provided a module for minimizing cross current in a main amplifier comprising switches.

Other aspects of the invention are recited in the dependent claims attached hereto.

BRIEF DESCRIPTION OF THE DRAWINGS

Other features and advantages of the invention will become apparent from the following description of non-limiting exemplary embodiments, with reference to the appended drawings, in which.

DETAILED DESCRIPTION

Next an embodiment of the present invention is described in more detail with reference to the attached figures.

Figure 5:
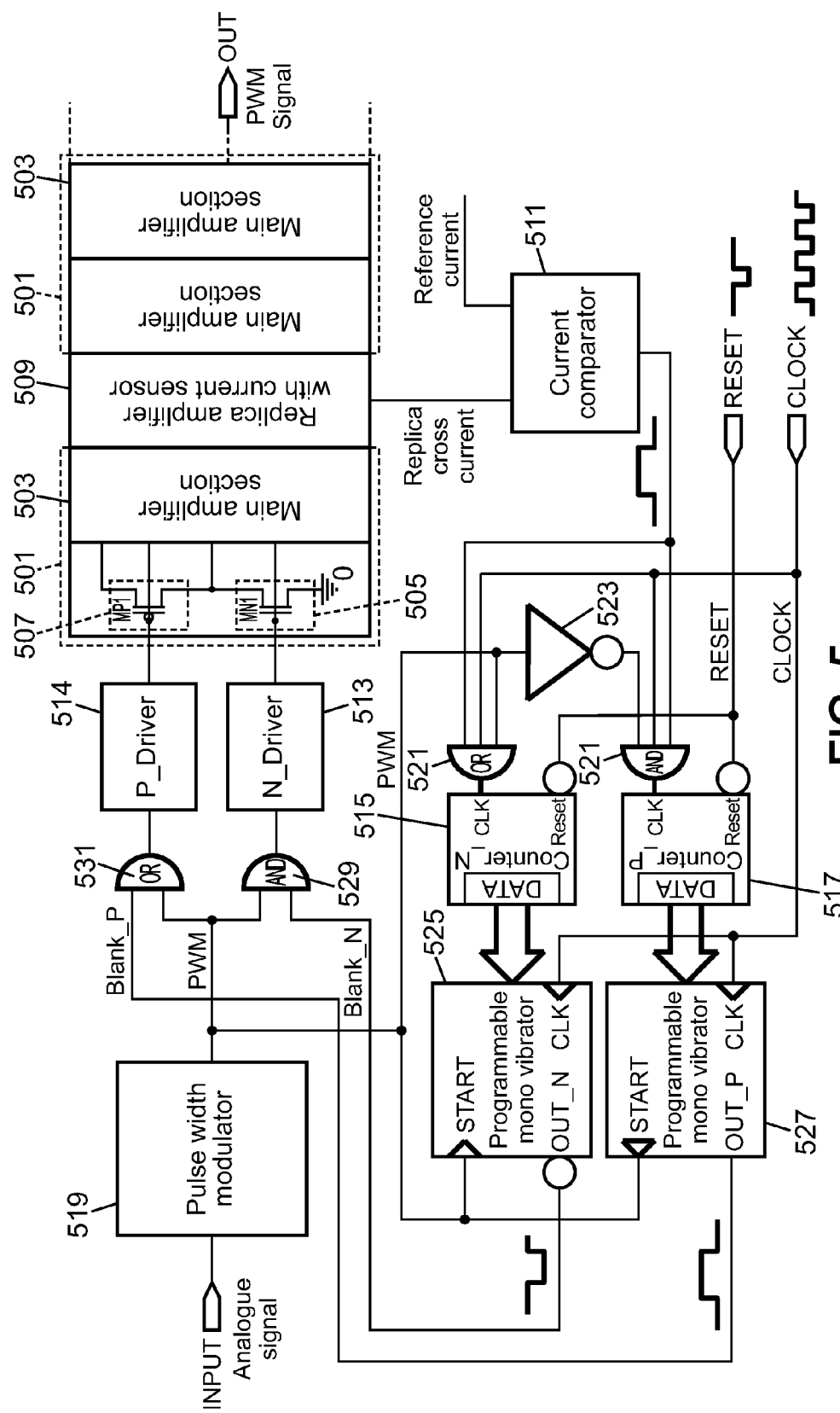
FIG. 5 is a simplified block diagram of a circuit configuration in accordance with an embodiment of the present invention.

FIG. 5 shows a simplified block diagram of a configuration that is arranged to implement the method in accordance with an embodiment of the present invention. The method is based on an idea of coupling a replica amplifier with a current sensor to the main amplifier. The replica amplifier is matched to the main amplifier meaning that the orientation of the transistors of the replica amplifier is the same as the orientation of the transistors of the main amplifier and all the transistors operate essentially at the same temperature and use the same supply voltage. Furthermore, the physical size of the replica amplifier in some implementations is the same as the size of the transistors of the main amplifier. The replica amplifier is placed between the transistors of the main amplifier as explained later on or at least placed close to the transistors of the main amplifier. The duration of the sensed cross current is compared with a small enough reference current. A comparator comparing these currents generates an output pulse with duration equal to the duration of the cross current in the replica amplifier. The duration of that pulse is measured and used to generate a dead time pulse, blanking the pre-driver inputs.

The proposed circuit has a regulated dead time. The idea is to use minimal sufficient dead time corresponding to the operating conditions. The main amplifier 501 has a "slice" implementation and may contain several tenths or even hundreds of slices 503. Every slice 503 contains one low side switch (NMOS) 505 and one high side switch (PMOS in the considered case) 507. All of the slices 503 are working in parallel, forming one powerful output stage.

The idea is that one replica amplifier 509 with a current sensor can be included between the slices 503 of the main amplifier 501. The replica amplifier 509 is isolated from the load, but the MOS transistors of the replica transistor 509 should be matched to the transistors 505, 507 of the main amplifier 501. The replica amplifier 509 has very similar operating conditions as the output stage of the main amplifier 501 and will reproduce the cross current appearing in the main amplifier 501 during the transitions.

The reproduced cross current has similar shape and duration as the cross current of the main amplifier 501. However, the replica cross current is generally much lower than the main amplifier cross current due to the smaller physical size of the replica amplifier 509 compared to the physical size of the main amplifier 501. Because the replica amplifier 509 is not connected to the load, only the cross current will flow through the transistors of this amplifier. One current sensing circuit can be added to the replica amplifier 509 and the output current will be a replica cross current of the power stage.

In the present invention the replica cross current is used for defining the minimal sufficient dead time. An important parameter is the duration of the cross current. The cross current can be compared to a small reference current by a current comparator 511.

The output of the comparator 511 is arranged to give a pulse, with duration, similar to the cross current duration. The pulse duration can be converted by counters 515, 517 to a binary code and stored. The stored number can be used for generation of a blocking, also called blanking, signal for pre-drivers 513, 514.

Figure 1:
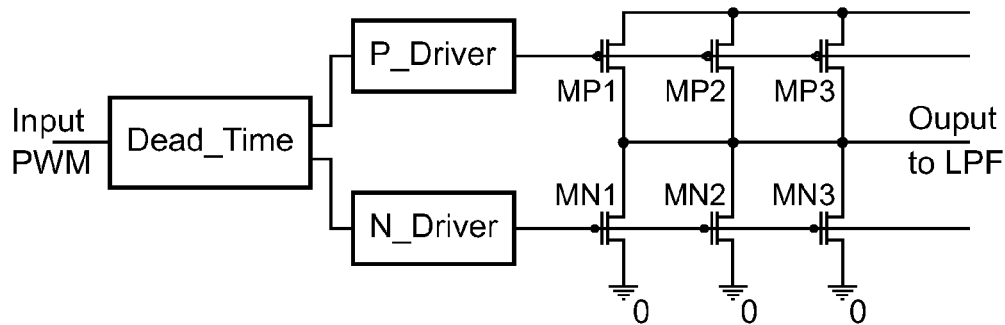
FIG. 1 shows a simplified block diagram of a typical output stage of a CMOS implementation.
Figure 2:
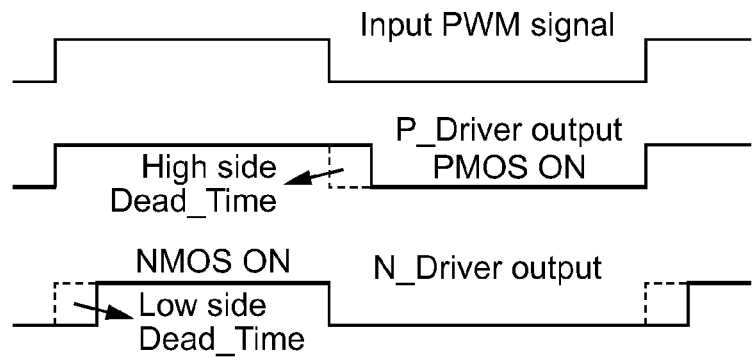
FIG. 2 shows the effect of a PWM input signal in the configuration of FIG. 1.
Figure 3:
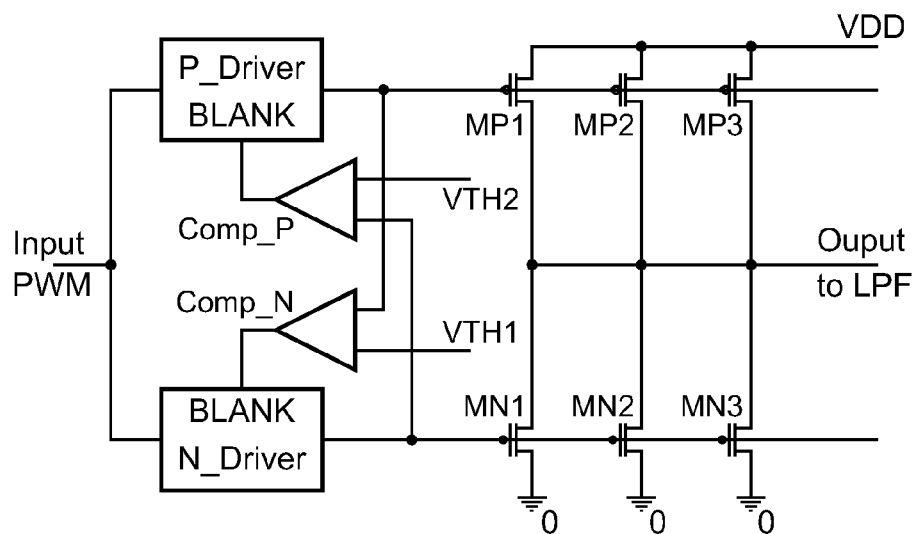
FIG. 3 shows a simplified block diagram of one prior art solution for avoiding cross current.
Figure 4:
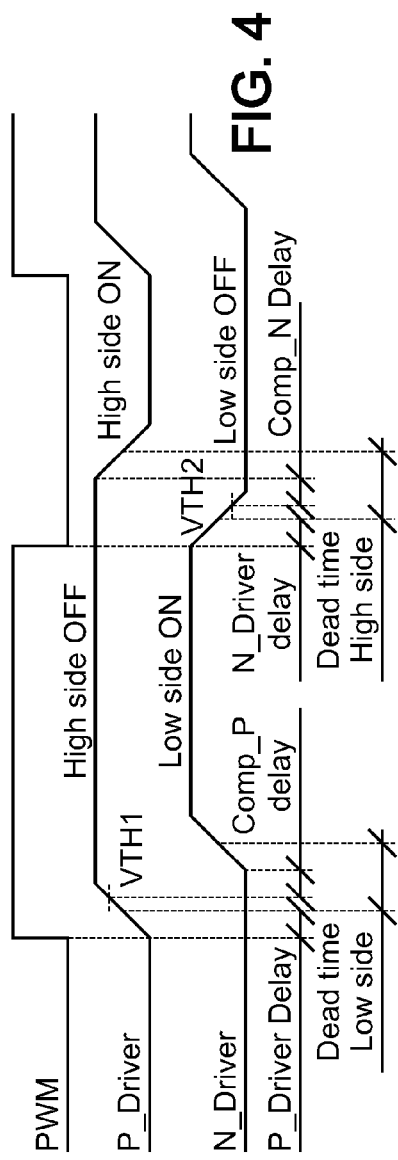
FIG. 4 shows in a graph form the switching on and off of the pre-drivers of FIG. 3.

The advantage of the presented approach is the simplicity and the high accuracy of the dead time, matched to the cross current duration of the main amplifier 501. The required high speed of the used current comparator 511 is relatively easy to achieve. By nature, the current comparator 511 is much faster than the voltage comparators of FIG. 3.

Figure 6:
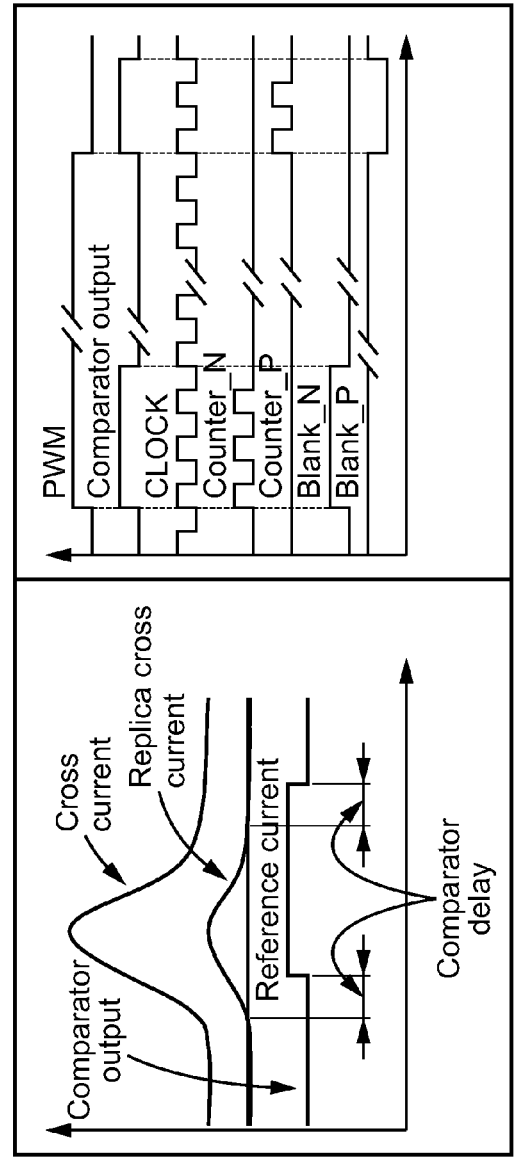
FIG. 6 shows in a graph form the operation of the circuit shown in FIG. 5.

The cross current, reproduced by the replica amplifier 509 can be scaled down for saving power and silicon area. The reproduced replica cross current is compared to a small enough reference current as illustrated by FIG. 6. When the replica cross current exceeds the reference current, the comparator 511 will be at a high output potential. The delay time of the comparator 511 is not critical if the delays for the rising and falling edges are similar.

The output of the comparator 511 enables the clock to the counters 515, 517. The signal from a pulse width modulator (PWM) applied to triple input AND elements 521 selects the corresponding counter 515, 517. As illustrated by FIG. 6, the frequency of the clock signal has to be sufficiently high so that it can be used for calculating the length of the comparator pulse. Here the number of clock signal pulses that fit inside the comparator pulse can be used for calculating the length of the comparator pulse.

The counter_N 515 is arranged to define the dead time for the low side driver (N_Driver) 513 and further arranged to count the clock pulses when the PWM signal is high.

The counter_P 517 is connected to the PWM 519 through an inverter 523 and is arranged to count the clock pulses when the PWM signal is low.

If RESET pulse is applied, the circuit is forced to the initial condition with zero or small initial dead time. The cross current will appear and a new value of the duration will be measured and stored in the counters. The RESET has to be performed periodically, for example every few seconds, to adapt the dead time to the possible changes in the operating conditions. The counters 515, 517 keep the last measured cross current duration between 2 resets.

If the operating conditions between 2 resets become worse and a cross current appears again, the comparator 511 will generate a pulse again and the counters 515, 517 will increase their value until the cross current disappears. On the other hand, if the operation conditions between 2 resets become better, the counters 515, 517 will keep their value unchanged.

Programmable digital mono vibrators 525, 527 produce blanking pulses according to the stored values in the counters 515, 517. The PWM signal is used to start the mono vibrators 525, 527. The rising edge of the PWM signal starts the "Blank_N" mono vibrator 525. The produced pulse has a low active level. The falling edge of the PWM signal starts the "Blank_P" mono vibrator 527. The produced pulse has a high active level.

The application of low level to an AND element 529 will set the input of N_Driver 513 to the inactive "low" level for the low side, ignoring the PWM signal. Applying high level to an OR element 531 will set the input of P_Driver 514 to the inactive "high" level for the high side, ignoring the PWM signal. By this way the propagation of the PWM signal will be blocked during the cross current event. However, the PWM signal is blocked only for the side of transistors that are currently switched off to delay the switching on of these transistors.

One possible implementation for the mono vibrators 525, 527 uses countdown counters with parallel data preset and the same clock generator. In this case the blanking pulses will be an exact reproduction of the comparator pulses.

Figure 7:
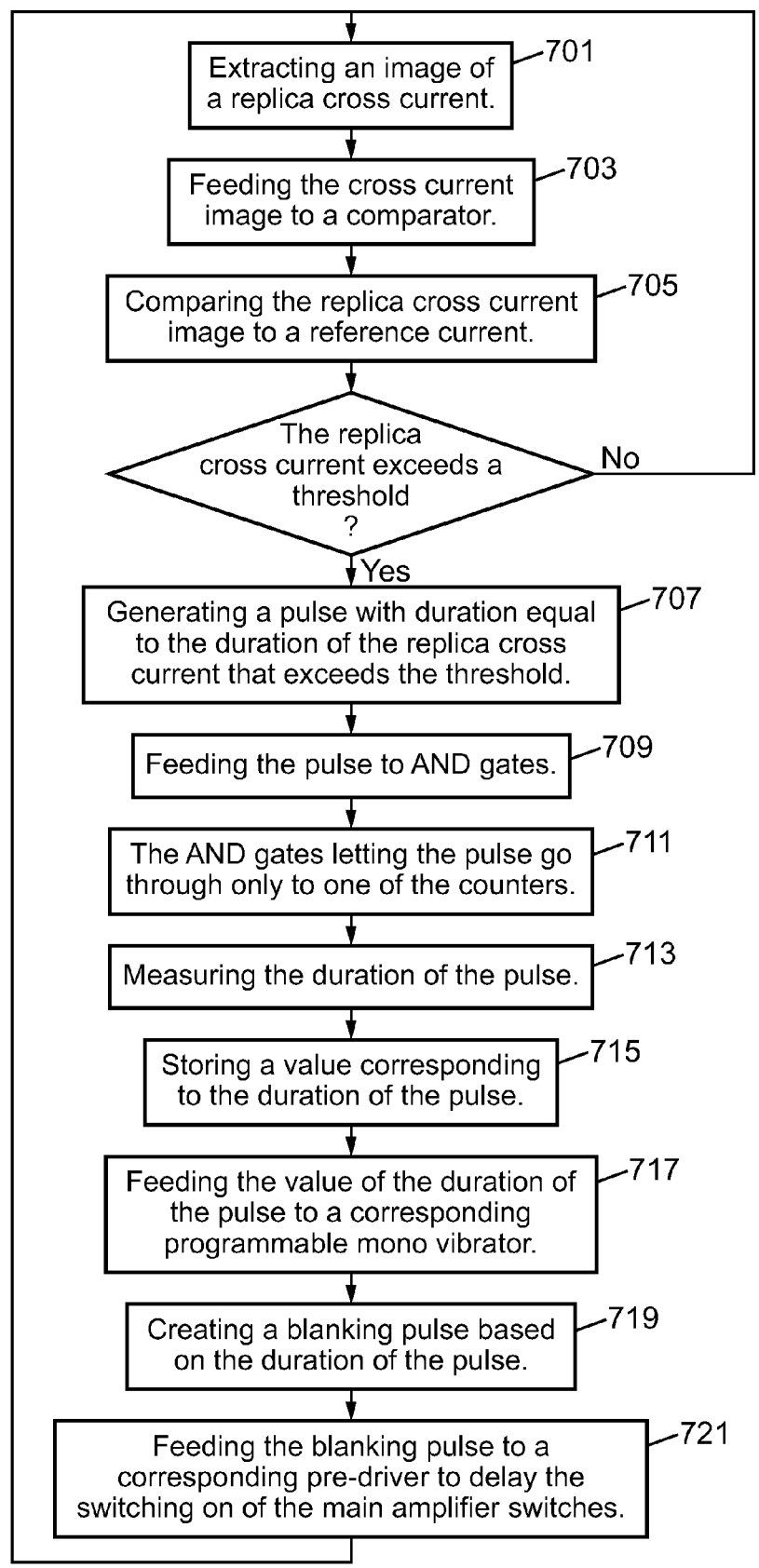
FIG. 7 is a flow chart illustrating an embodiment of the present invention.

FIG. 7 illustrates a flow chart describing the operation of the circuit described above in accordance with an embodiment of the invention. In step 701 the current sensor of the replica amplifier 509 extracts an image of the replica cross current. In step 703 the replica amplifier 509 feeds this image to the current comparator 511. In step 705 the current comparator 511 compares the image of the replica cross current to a reference current from a reference current source. If the replica cross current does not exceed a given threshold, then the process continues in step 701.

On the other hand, if the replica current exceeds the given threshold value, then the process continues in step 707 by the current comparator 511 generating a pulse of which duration or length is equal to the duration or length of the replica cross current. In step 709 the current comparator 511 feeds this pulse to the AND gates 521 that are placed in front of the counters 515, 517. These gates then by taking account the PWM signal let the pulse to enter in step 711 the actual counter 515, 517 so that only one counter becomes active at a given time instant. This is due to the fact that the inverter 523 inverts the PWM pulse to the counter_P 517.

The counter that has received the pulse then in step 713 measures the duration of the pulse by using the clock signal by calculating how many clock signal pulses fit inside the pulse. In step 715 the value of the duration is stored in the memory of the counter 515, 517. Then in step 717 the value of the duration is fed to the corresponding programmable mono vibrator 525, 527. In step 719 the mono vibrator 525, 527 creates a blanking pulse of which length or duration corresponds to the duration of the replica cross current. Then finally the blanking pulse is fed in step 721 to the corresponding pre-driver 513, 514 to delay the switching on of the main amplifier switches as explained in connection with FIG. 5.

The method was partially tested by simulations, especially the production of a pulse with duration equal to the cross current.

Figure 8:
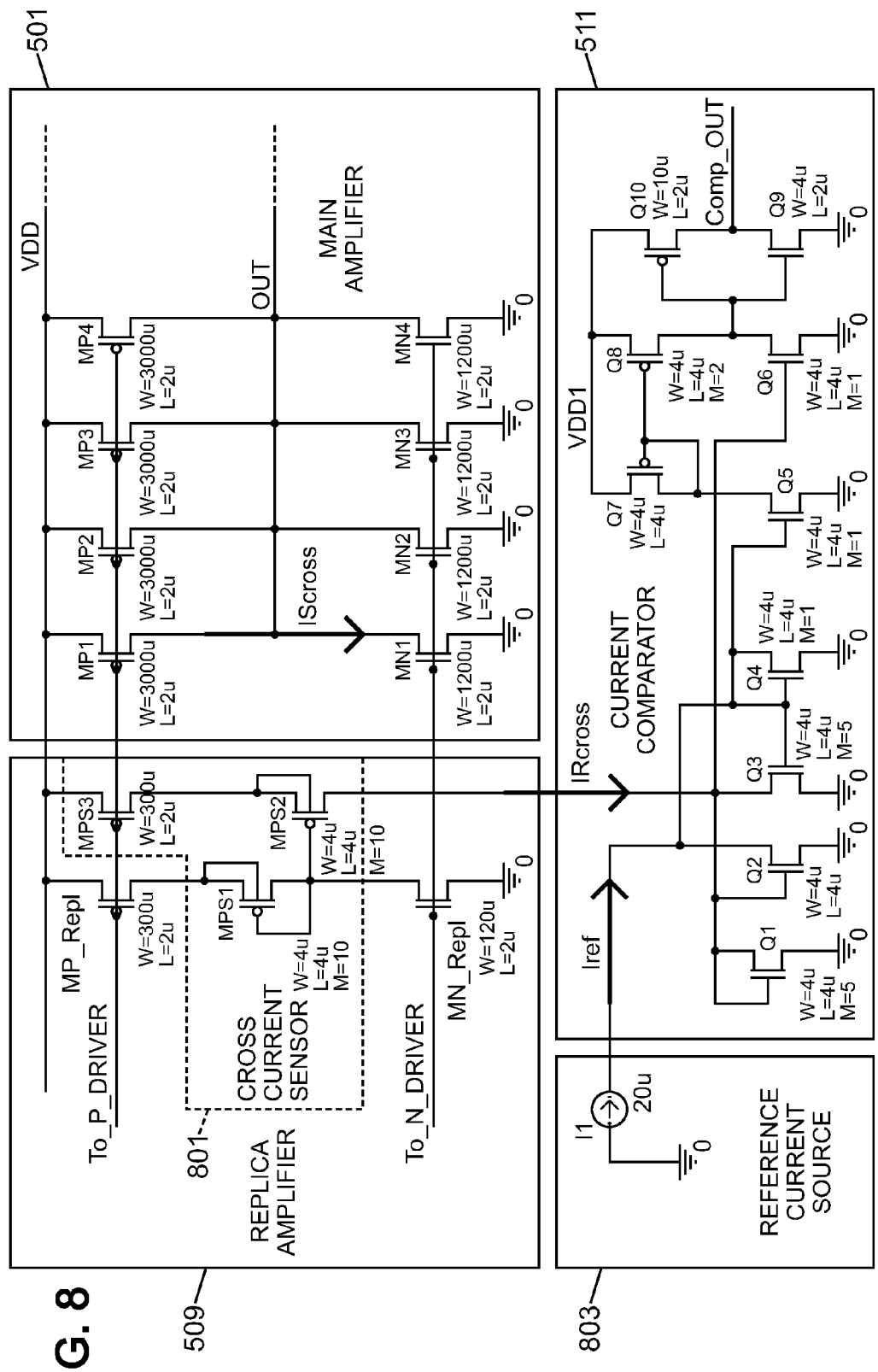
FIG. 8 illustrates in more detail the essential elements of FIG. 5.

A simple practical implementation in a 2 μm HV CMOS process of the replica amplifier 509 comprising the current sensor 801, the main amplifier 501, the current comparator 511 and the reference current source 803 is shown in more detail in FIG. 8. In this figure, L is the length of a transistor, W is the width of a transistor and M is the number of fingers of a transistor.

Transistors MN1, MN2, MN3 . . . and MP1, MP2, MP3 . . . , form the main amplifier 501. The replica amplifier 509 contains the transistors MN_Repl and MP_Repl, which in this example are scaled down 10 times for power and area saving.

Transistor MPS1 is in diode connection and together with MPS2 implements a current mirror. Transistor MPS3 breaks the current through MPS2 when the low side is ON and aligns the source potential to the potential of MPS1 during the transitions. The mirrored current (replica cross current) is applied to the current comparator 511 implemented with the transistors Q1-Q10. The replica cross current is compared to a reference current which has to be small, for example 20 μA.

Figure 9:
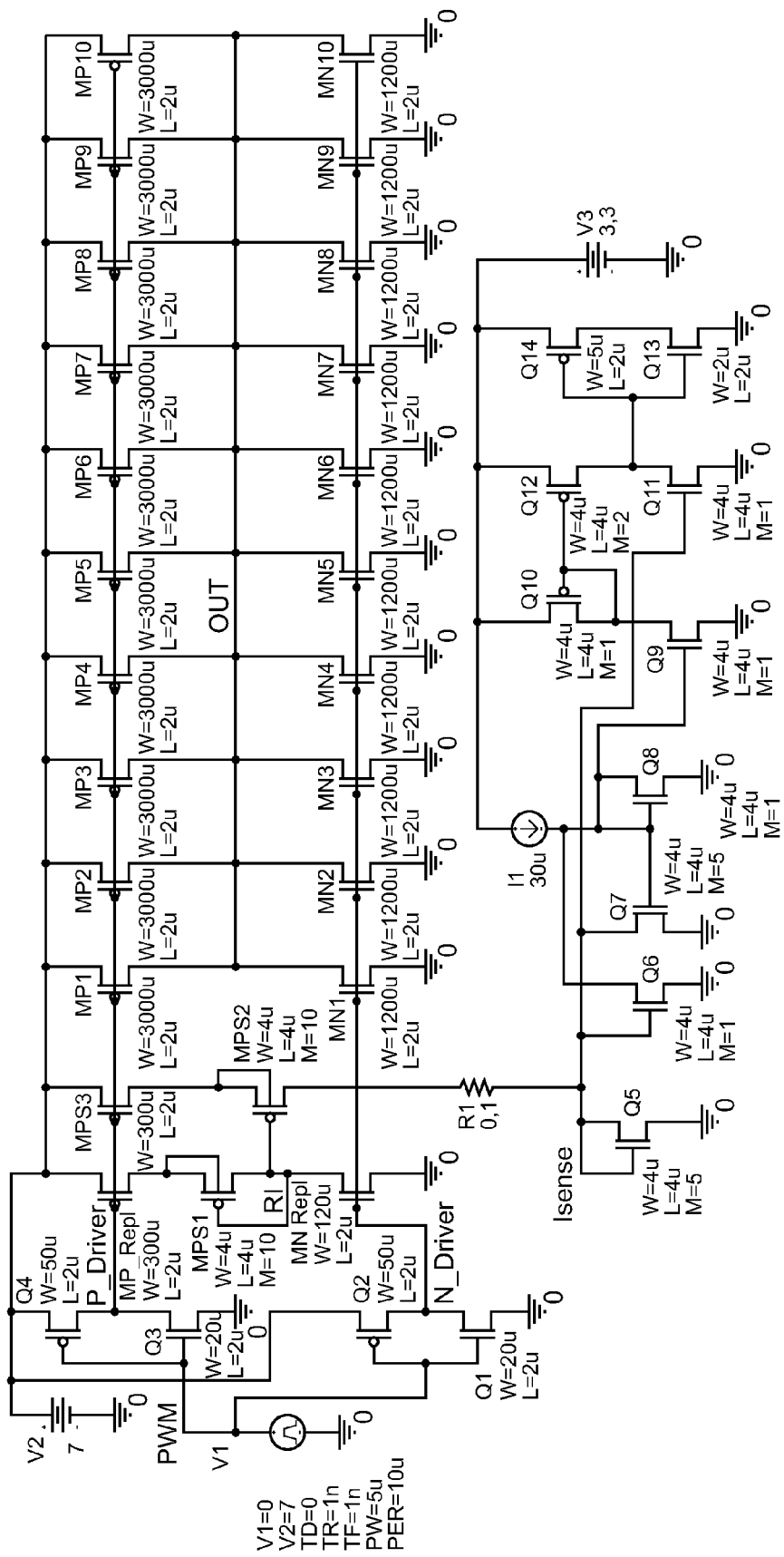
FIG. 9 shows a simulation setup for carrying out simulations.

A full simulation setup is given in FIG. 9. Two inverters are used instead of pre-drivers. One inverter contains transistors Q1 and Q2, whereas the other inverter contains transistors Q3 and Q4. Resistor R1 is used for current measurement only and does not play another role.

Figure 11:
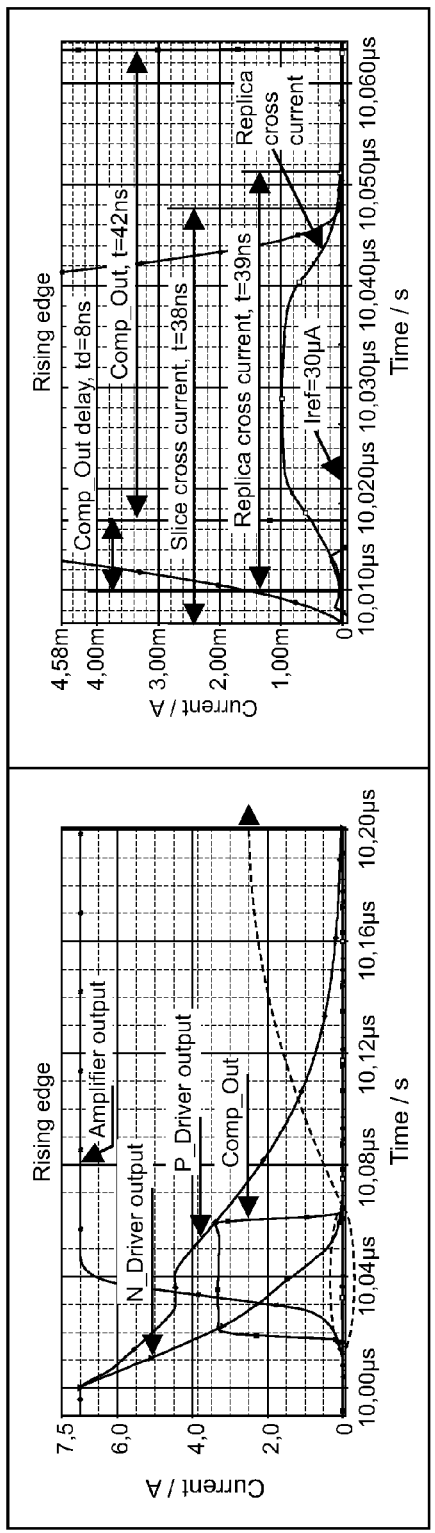
Figure 12:
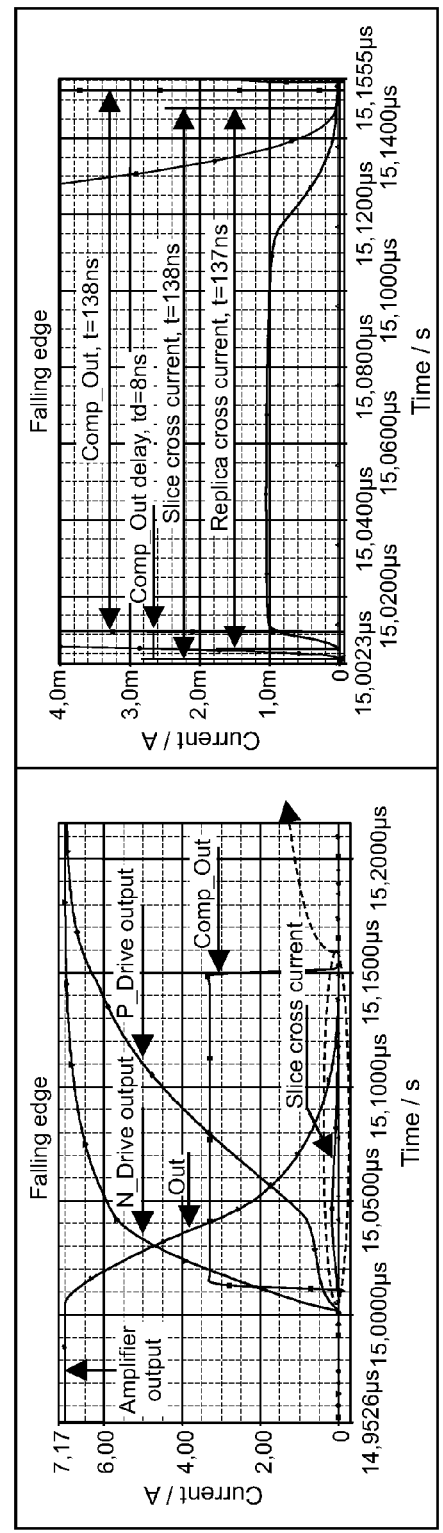
Figure 13:
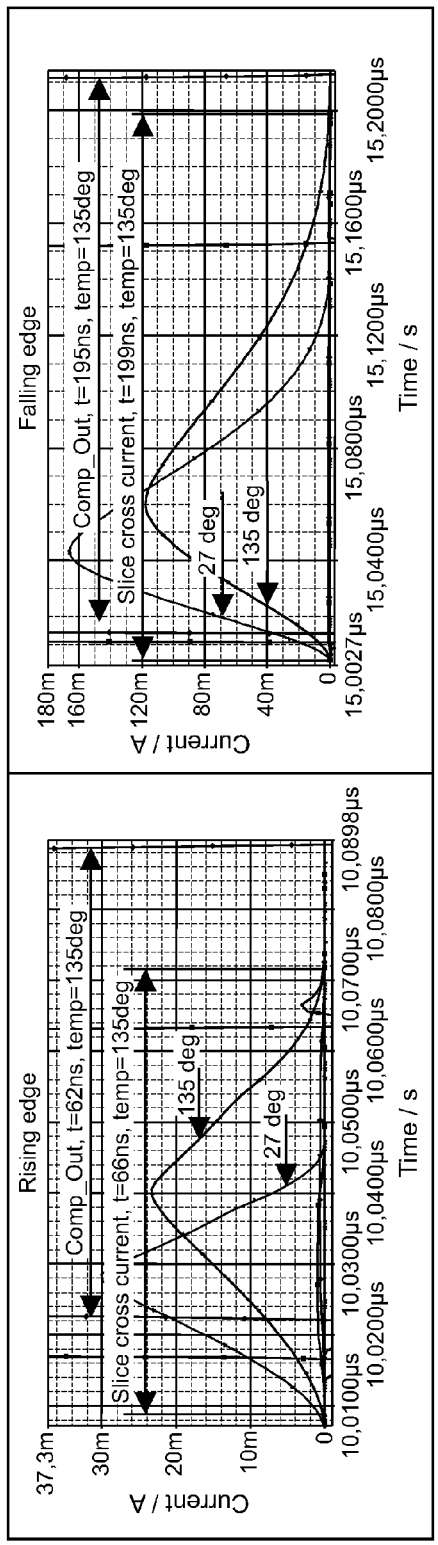

Simulation results shown in FIGS. 10, 11, 12 and 13 are obtained by using stronger pre-drivers with dimensions: Q1=Q3=20/2 μm (i.e. the channel width is 20 μm and the channel length is 2 μm), Q2=Q4=50/2 μm. FIG. 13 presents the temperature variation. The simulation is performed for 27 and 135 degrees.

Figure 10:
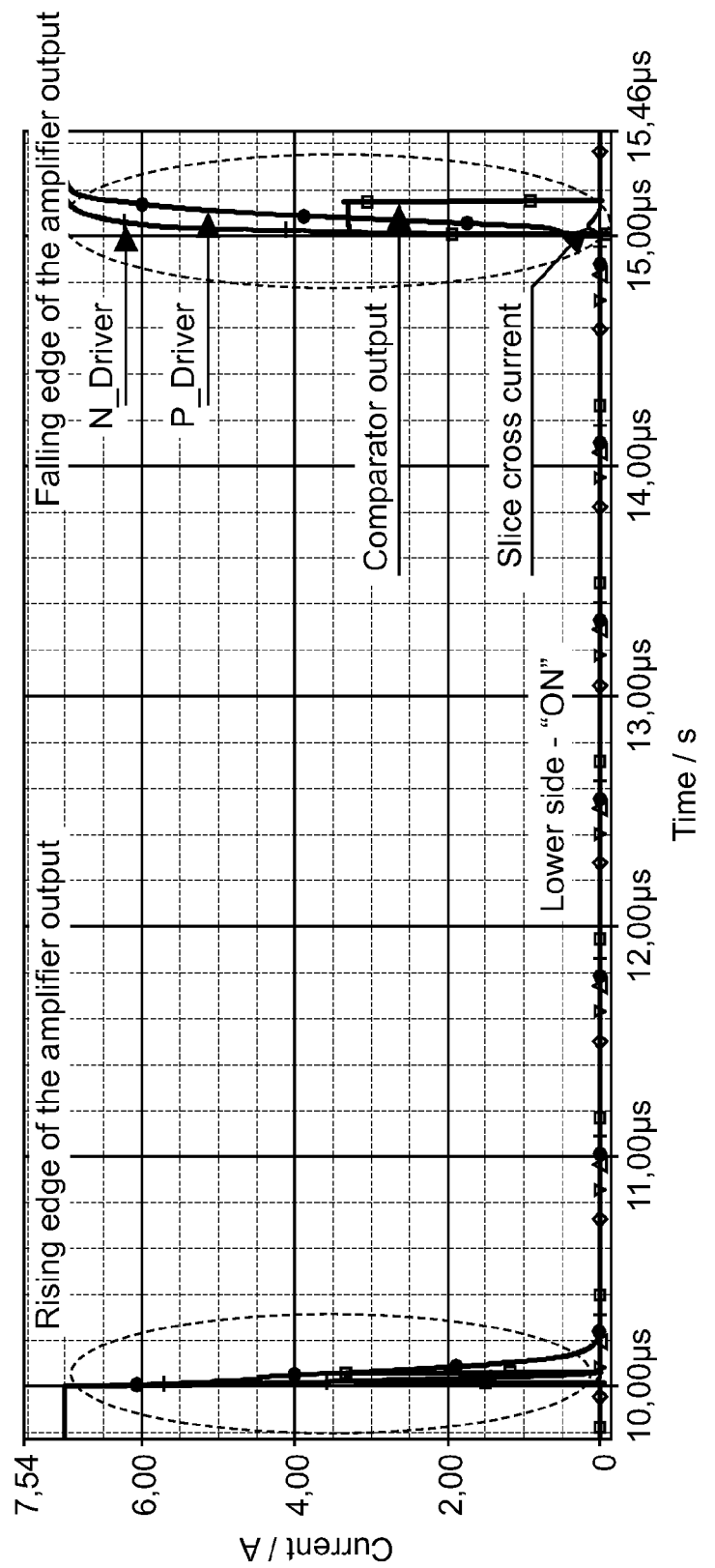
FIGS. 10-15 show simulation results.

In FIG. 10, it can be seen that at the falling edge of the amplifier output (i.e. rising edge of the amplifier input), the N_Driver graph goes up faster than the P_Driver graph, which means that the MN transistor will be switched on before the MP can be turned off. The falling edge of the amplifier output means switching on the MN transistors, whereas with this falling edge the MP transistors will be switched off. Due to the fact that the MN and MP transistors are switched on simultaneously for a short time period, a cross current is created as can be seen in this figure. The length of the comparator output pulse corresponds to the length of the cross current.

FIG. 11 illustrates the rising edge of FIG. 10 in more detail at a temperature of 27 degrees Celsius. The part inside the dashed line in the left part of FIG. 11 can be zoomed and is shown in the right part of this figure. FIG. 12 illustrates the situation for the falling edge.

FIG. 13 illustrates the effect of temperature on the cross current. The left part of this figure illustrates the rising edge and the right part illustrates the falling edge. Temperatures 27 and 135 degrees Celsius have been used in this simulation. It can be concluded that the duration of the cross current is considerably shorter at the temperature of 27 degrees than at the temperature of 135 degrees.

Figure 14:
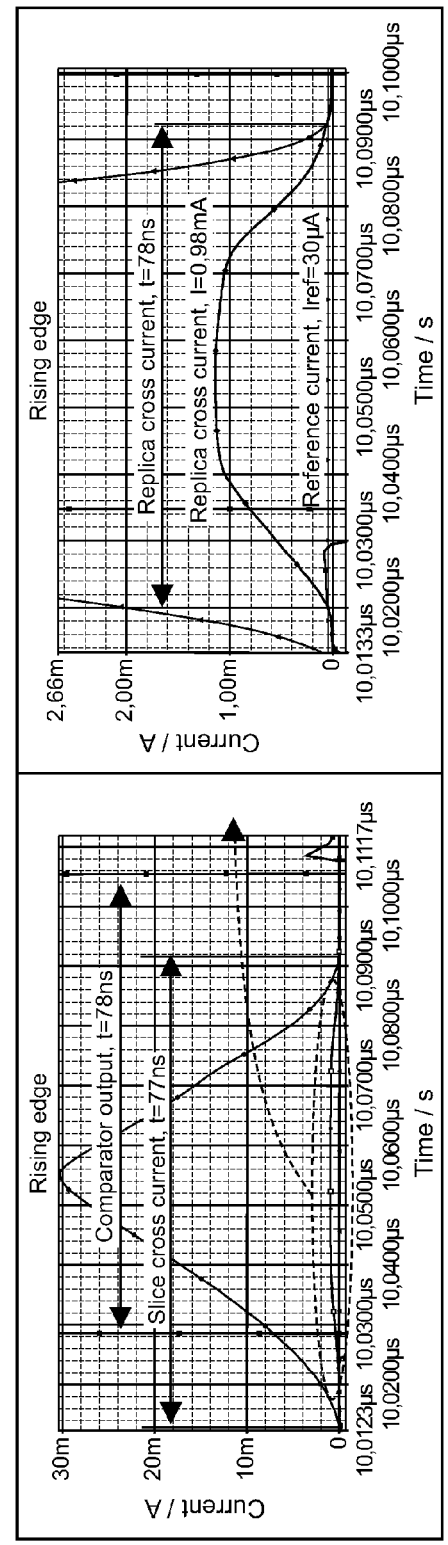
Figure 15:
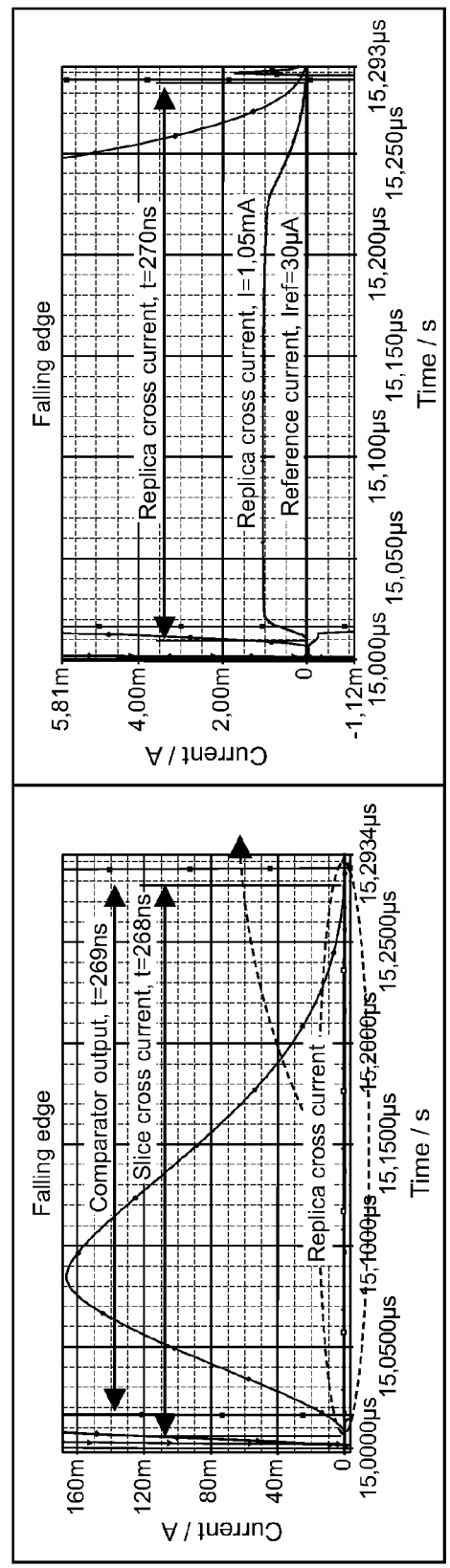

The simulation results in FIGS. 14 and 15 are obtained by using smaller pre-drivers with dimensions: Q1=Q3=10/2 μm and Q2=Q4=25/2 μm. The purpose of the smaller drivers is to be reduce the slew rate, but in this way the cross current duration in the main amplifier 501 is increased. The current comparator 511 has to produce a longer pulse matched to the duration of the increased cross current duration.

The simulation results clearly prove the usefulness of the method. The simplest possible circuits have been used. The achieved results have a good accuracy and demonstrate the reliability of the method. The matching between the extracted pulses and the actual current spike duration is very good. The differences between the cross current and the extracted pulses are about several ns for different slew rates and temperatures. The current comparator has a delay (about 8 ns), which does not play a significant role in the presented method. The conclusion is that the method improves the switching quality in big push-pull output stages.

Above one embodiment of the present invention was described in connection with a class D audio amplifier. The invention can also be used in high power switching output drivers, such as charge pump bottom plate drivers, coil drivers, etc.

The invention also relates to a computer program product that is able to implement any of the method steps as described above when loaded and run on computer means of an electronic device. The computer program may be stored/distributed on a suitable medium supplied together with or as a part of other hardware, but may also be distributed in other forms, such as via the Internet or other wired or wireless telecommunication systems.

The invention also relates to an integrated circuit that is arranged to perform any of the method steps in accordance with the embodiments of the invention.

While the invention has been illustrated and described in detail in the drawings and foregoing description, such illustration and description are to be considered illustrative or exemplary and not restrictive, the invention being not restricted to the disclosed embodiment. Other variations to the disclosed embodiment can be understood and effected by those skilled in the art in practicing the claimed invention, from a study of the drawings, the disclosure and the appended claims.

In the claims, the word "comprising" does not exclude other elements or steps, and the indefinite article "a" or "an" does not exclude a plurality. A single processor or other unit may fulfil the functions of several items recited in the claims. The mere fact that different features are recited in mutually different dependent claims does not indicate that a combination of these features cannot be advantageously used. Any reference signs in the claims should not be construed as limiting the scope of the invention.

The invention claimed is:

1. A method for minimizing cross current in an amplifier comprising switches, the amplifier being coupled to a replica amplifier comprising a current sensor, the amplifier being further coupled to a current comparator, the method comprising:
   extracting, by the current sensor, an image of a replica cross current;
   comparing, by the comparator, the replica cross current image to a reference current;
   creating, by the comparator, a first pulse having a duration substantially equal to a replica cross current duration sensed by the current sensor, the first pulse being adapted to enable generation of a second pulse comprising a second pulse duration substantially equal to the replica cross current duration;
   providing the second pulse of the amplifier, the second pulse adapted to prevent at least some of the switches from switching ON during the pulse duration of the second pulse in order to minimize the cross current in the amplifier.

2. The method according to claim 1, wherein the comparator is further connected to at least one counter, and wherein the method further comprises measuring by, at least one of the counters, a count duration of the first pulse.

3. The method according to claim 2, wherein the count duration is measured by counting the number of reference clock pulses that fit inside the first pulse.

4. The method according to claim 3, further comprising generating the second pulse, by a pulse generation element, based on the count duration.

5. The method according to claim 2, further comprising applying a reset signal to the counter(s) substantially periodically reset the count duration to zero or to an initial value close to zero.

6. The method according to claim 1, wherein providing the second pulse to the amplifier further comprises applying the second pulse(s) to at least one pre-driver prior to providing the second pulse(s) to the amplifier; and using the second pulse(s) to delay a switching ON of corresponding switches that are switched OFF.

7. The method according to claim 1, wherein the replica cross current duration has substantially the same duration as the amplifier's cross current duration.

8. The method of claim 1, wherein a computer program product comprises the instructions for implementing the steps of the method when loaded and run on computer means of an electronic device.

9. A module arranged to minimize cross current in an amplifier comprising switches, the module further comprising:
   a replica amplifier comprising:
      a current sensor adapted to extract an image of a replica cross current in the replica amplifier; and
      a comparator adapted to compare the image of the replica cross current to
   a reference current, and adapted to create a first pulse having a duration substantially equal to a replica cross current duration sensed by the current sensor, the first pulse being adapted to enable generation of at least one second pulse provided to the amplifier and adapted to prevent, during the second pulse, at least some of the switches from switching ON in order to minimize a cross current in the amplifier.

10. The module according to claim 9, wherein the module further comprises two counters each arranged to count a count duration of the first pulse and wherein a time duration of the second pulse(s) substantially corresponds to the count durations of the first pulse.

11. The module according to claim 10, wherein the module further comprises an AND gate between each of the counters and the comparator, each AND gate having three inputs:
   a first input for a reference clock signal, a second input for the first pulse from the current comparator and a third input for a module input signal, the module input signal being fed to one of the AND gates through an inverter ensuring that only one of the two counters is counting at a time.

12. The module according to claim 10, wherein the module further comprises two pulse generation elements each connected to receive the count duration from a different one of the two counters, and wherein each of the pulse generation elements is arranged to create the at lease one second pulse based on the duration of the first pulses.

13. The module according to claim 9, wherein the module further comprises two pre-drivers connected to receive a different one of the at least one second pulse and provide the second pulse(s) to at least one of the amplifier and the replica amplifier, each of the pre-drivers being arranged, based on the received second pulse, to block an input signal to corresponding switches that are currently switched OFF and delay the switching ON of these switches.

14. The module according to claim 12, wherein the module further comprises two pre-drivers connected to receive a different one of the at least one second pulse and provide the second pulse(s) to at least one of the amplifier and the replica amplifier, each of the pre-drivers being arranged, based on the received second pulse, to block an input signal to corresponding switches that are currently switched OFF and delay the switching ON of these switches.

15. The module according to claim 14, wherein the module further comprises:
   an OR gate between one of the pre-drivers and one of the pulse generation elements; and
   an AND gate between the other pre-driver and the other pulse generation element, the OR and AND gates each having two inputs, one input signal, being one of the at least one second pulse coming from one of the pulse generation elements and the other input being the module input signal.

16. The module according to claim 9, wherein the amplifier is divided into slices, wherein each slice comprises two switches and the slices are arranged to work in parallel, the replica amplifier being connected between two slices.

* * * * *